(12) United States Patent
Sasaki et al.

(10) Patent No.: US 7,161,089 B2
(45) Date of Patent: Jan. 9, 2007

(54) ELECTRONIC COMPONENT

(75) Inventors: Satoshi Sasaki, Yuri-gun (JP); Kazushi Tachimoto, Honjo (JP); Mitsunao Homma, Yuri-gun (JP)

(73) Assignee: TDK Corporation, Tokyo (JP)

( * ) Notice: Subject to any disclaimer, the term of this patent is extended or adjusted under 35 U.S.C. 154(b) by 267 days.

(21) Appl. No.: 10/721,453

(22) Filed: Nov. 26, 2003

(65) Prior Publication Data

US 2004/0112635 A1    Jun. 17, 2004

(30) Foreign Application Priority Data

Dec. 4, 2002   (JP)   ............... 2002-352941
Dec. 13, 2002  (JP)   ............... 2002-363119

(51) Int. Cl.
*H01R 12/04* (2006.01)
(52) U.S. Cl. ...................... 174/262; 174/261
(58) Field of Classification Search ................ 174/262, 174/260, 261; 361/792–795
See application file for complete search history.

(56) References Cited

U.S. PATENT DOCUMENTS

| 5,117,069 A | * | 5/1992 | Higgins, III | ................ 174/261 |
| 5,414,222 A | * | 5/1995 | Sen et al. | ................... 174/262 |
| 5,841,075 A | * | 11/1998 | Hanson | ...................... 174/250 |
| 6,273,558 B1 | * | 8/2001 | Kitahara | ..................... 347/72 |
| 6,395,995 B1 | * | 5/2002 | Joy et al. | .................... 174/260 |
| 6,433,301 B1 |   | 8/2002 | Dunsky et al. | |
| 2001/0033474 A1 | | 10/2001 | Sakai et al. | |

FOREIGN PATENT DOCUMENTS

| EP | 0 435 230 A2 | 7/1991 |
| EP | 0 889 585 A2 | 1/1999 |
| EP | 0 987 773 A2 | 3/2000 |
| JP | A 07-131084 | 5/1995 |
| JP | A 08-316542 | 11/1996 |
| JP | A 09-092753 | 4/1997 |
| JP | A 2000-094679 | 4/2000 |
| JP | A-2000-151111 | 5/2000 |
| JP | 2000-286125 | * 10/2000 |
| JP | A-2000-286125 | 10/2000 |
| JP | A 2001-358016 | 12/2001 |
| JP | A 2002-036544 | 2/2002 |
| JP | A-2002-064274 | 2/2002 |
| JP | A 2002-254634 | 9/2002 |

* cited by examiner

*Primary Examiner*—Dean A. Reichard
*Assistant Examiner*—Yuriy Semenenko
(74) *Attorney, Agent, or Firm*—Oliff & Berridge, PLC

(57) ABSTRACT

An electronic component comprises a substrate having a through hole formed in a thickness direction thereof; and a conductor, disposed in the through hole, for electrically connecting one side of the substrate to the other side thereof. The through hole has a major axis diameter and a minor axis diameter on at least one of one side and the other side of the substrate.

11 Claims, 11 Drawing Sheets

ELECTRONIC COMPONENT

BACKGROUND OF THE INVENTION

1. Field of the Invention

The present invention relates to an electronic component.

2. Related Background Art

Known as this kind of electronic components is one including a substrate having a through hole formed in a thickness direction thereof; and a conductor, disposed in the through hole, for electrically connecting one side of the substrate to the other side thereof. In general, the through hole has a cylindrical form in which the opening on one side and that on the other side have the same area or a conical form in which the opening area on one side is greater than the opening area on the other side.

SUMMARY OF THE INVENTION

In recent years, as electronic components have been made smaller, through holes have been required to narrow their width. Electronic components, e.g., piezoelectric components such as piezoelectric buzzers, sounding bodies, piezoelectric device, and piezoelectric actuators, it is strongly desired for through holes to set their diameter to about 0.2 mm at most, and 30 to 50 µm in smaller ones.

However, since conventional cylindrical or conical through holes have circular openings, the through hole opening area decreases when the through hole diameter is narrowed, whereby connecting strength decreases in the conductors disposed within the through holes. Therefore, conventional electronic components have been problematic in that, as the through hole diameter is made smaller, the reliability in connection effected by the conductors decreases, and the yield is lowered.

In view of the foregoing, it is an object of the present invention to provide an electronic component which can reduce the size of a product by narrowing a through hole.

It is another object of the present invention to provide an electronic component which can increase the yield by improving the reliability in connection effected by a conductor.

The electronic component in accordance with the present invention comprises a substrate having a through hole formed in a thickness direction thereof; and a conductor, disposed in the through hole, for electrically connecting one side of the substrate to the other side thereof; wherein the through hole has a major axis diameter and a minor axis diameter on at least one of one side and the other side of the substrate.

The through hole in the electronic component in accordance with the present invention has a major axis diameter and a minor axis diameter on at least one of one side and the other side of the substrate, whereby the width in the minor axis diameter direction becomes shorter as compared with the through hole having a circular opening in the conventional electronic component if these openings have the same area. This makes it possible to dispose through holes in a very narrow space, which can contribute to making products smaller.

In the through hole of the present invention, as compared with the through hole in the above-mentioned conventional electronic component, the width in the major axis diameter direction is greater even when the width in the minor axis diameter direction is the same as the opening diameter of the through hole in the conventional electronic component, whereby the opening area of the through hole on one side or the other side of the substrate increases. As a consequence, the reliability in connection effected by the conductor disposed in the through hole improves, and the yield increases.

Preferably, the through hole has a form satisfying $$1 < (D3/D4) \leq 5$$

where $D3$ is the major axis diameter on one side, and $D4$ is the minor axis diameter on the one side.

Preferably, the through hole has a form satisfying $$0.4 \leq (D5/D4) \leq 0.94$$

where $D4$ is the minor axis diameter on one side, and $D5$ is the minor axis diameter on the other side.

Preferably, the through hole comprises a plurality of holes arranged along the thickness direction of the substrate, whereas the holes formed adjacent each other in the thickness direction of the substrate have respective center axes shifted from each other as seen in a predetermined direction orthogonal to the thickness direction of the substrate.

Preferably, the predetermined direction orthogonal to the thickness direction of the substrate is the minor axis direction of the through hole.

Preferably, the through hole comprises a plurality of holes arranged along the thickness direction of the substrate, whereas the holes formed adjacent each other in the thickness direction of the substrate are kept from overlapping each other as seen in the thickness direction of the substrate.

Preferably, the electronic component further comprises a plurality of conductive films arranged with a gap therebetween extending in the thickness direction of the substrate, the conductor electrically connecting the conductive films to each other.

Preferably, the through hole has a length $D0$ of $$D0 \leq 500 \text{ µm}$$

in each conductive film as seen in a minor axis direction.

Preferably, the through hole is formed so as to have a major axis direction extending along a longitudinal direction of the conductive films.

Preferably, the conductive film comprises a first electrode film, a first terminal electrode film, a second electrode film, and a second terminal electrode film; the first electrode film and first terminal electrode film are disposed at the same position as seen in the thickness direction of the substrate with a first insulating gap therebetween; the second electrode film and second terminal electrode film are disposed at the same position as seen in the thickness direction of the substrate with a second insulating gap therebetween; the second electrode film opposes the first electrode film and first terminal electrode film by way of the substrate; the second terminal electrode film opposes the first electrode film by way of the substrate; the conductor includes a first conductor and a second conductor; the first conductor electrically connects the first electrode film and the second terminal electrode film to each other; and the second conductor electrically connects the second electrode film and the first terminal electrode film to each other.

Preferably, a group of the first electrode film and first terminal electrode film and a group of the second electrode film and second terminal electrode film are alternately disposed within the substrate with a gap in the thickness direction of the substrate.

Preferably, the substrate comprises a piezoelectric material and functions as an actuator.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Electronic components in accordance with embodiments of the present invention will be explained with reference to the drawings. In the explanation, constituents identical to each other or those having functions identical to each other will be referred to with numerals identical to each other without repeating their overlapping descriptions.

First Embodiment

Figure 1:
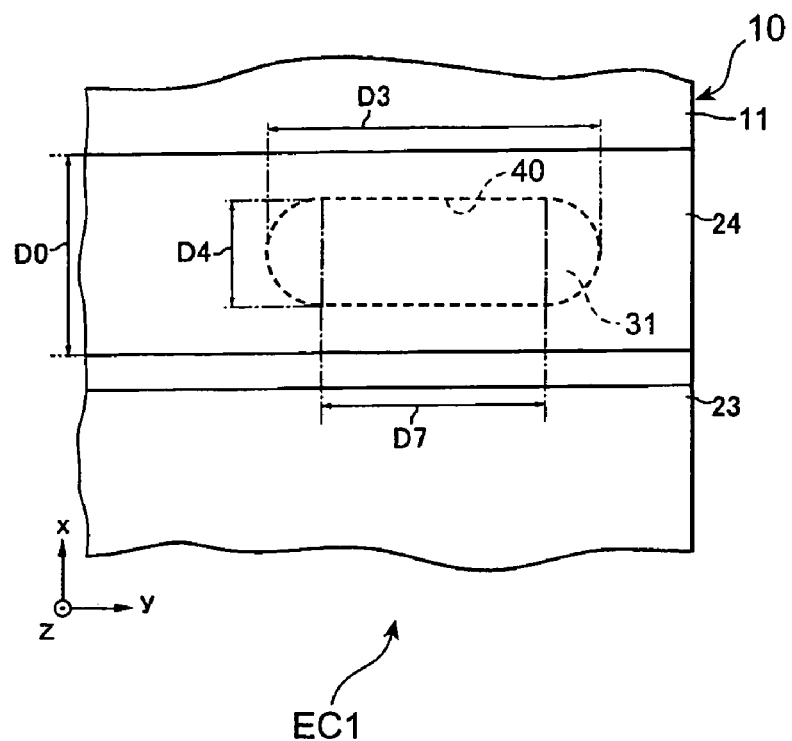
FIG. 1 is a plan view showing the electronic component in accordance with a first embodiment.
Figure 2:
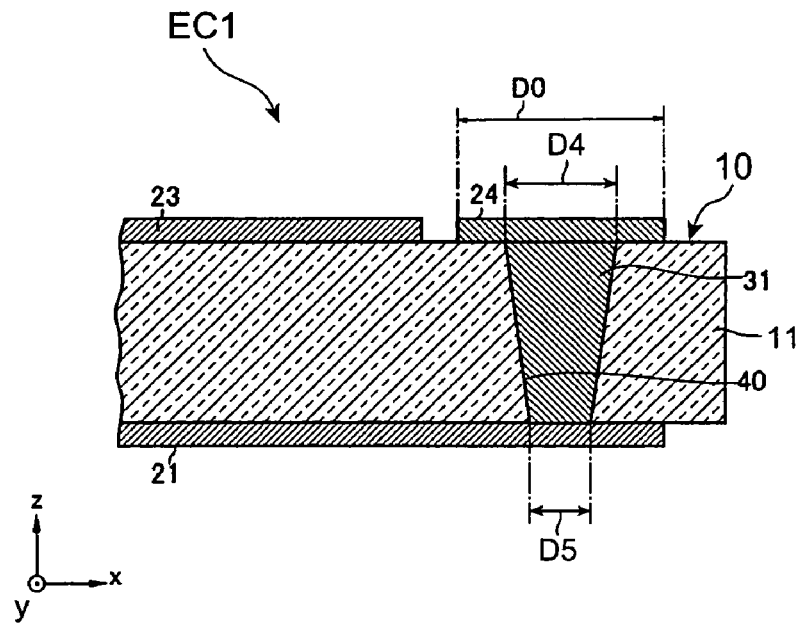
FIG. 2 is a sectional view showing the electronic component in accordance with the first embodiment.

FIG. 1 is a plan view showing the electronic component in accordance with the first embodiment. FIG. 2 is a sectional view showing the electronic component in accordance with the first embodiment. As shown in FIGS. 1 and 2, the electronic component EC1 comprises a substrate 10; conductive films (electrode films) 21, 23, 24; and a conductor 31. Words "upper" and "lower" used in the explanation correspond to the upward and downward directions in FIG. 2, respectively.

The material constituting the substrate 10 is appropriately chosen according to the aimed electronic component. When making a piezoelectric device, for example, the substrate 10 is constituted by a piezoelectric ceramics material. When making a chip capacitor, the substrate 10 is constituted by a ceramics dielectric material or organic dielectric material. When making a chip inductor, the substrate 10 is constituted by a ceramics magnetic material or composite magnetic material. In the first embodiment, the substrate 10 is made of an electrically insulating material.

The substrate 10 comprises a functional layer 11. Though the electronic component EC1 is a single-layer electronic component comprising only one functional layer 11 in FIG. 1, it may be a laminated electronic component comprising a plurality of functional layers. The function of the functional layer 11 depends on the material constituting the substrate 10.

Formed in a region between the conductive films 21 and 24 in the functional layer 11 (substrate 10) is a through hole 40 penetrating through the functional layer 11 in its thickness direction. The through hole 40 is formed so as to have a major axis direction extending along the longitudinal direction of the conductive film 24.

The through hole 40 can be formed by using a laser beam. The form of the through hole 40 can easily be set by adjusting the form of a mask. As the laser beam, harmonics of YAG can be used, for example. Preferably, the laser beam has a wavelength of at least 193 nm but not longer than 532 nm. When the wavelength is at least 193 nm but not longer than 532 nm, it becomes easier to control the through hole diameter, whereby through holes having a favorable quality can be formed with high efficiency. This can also reduce the processing residue occurring when forming through holes.

The functional layer 11 preferably has a thickness t1 of 1 $\mu m \leq t1 \leq 100$ μm, more preferably 5 μm $\leq t1 \leq 50$ μm. Specifically, the thickness t1 of the functional layer 11 is 40 μm, for example.

The conductive films 23, 24 are formed on the upper face (one side) of the functional layer 11. The conductive film 21 is formed on the lower face (other side) of the functional layer 11. The conductive films 23, 24 are separated from the conductive film 21 by a gap extending in the thickness direction z of the functional layer 11.

The conductor 31 electrically connects one side and the other side of the functional layer (substrate 10) to each other. The through hole 40 penetrating through the functional layer 11 between the conductive films 21 and 24 is filled with the conductor 31. As a consequence, the end face of the conductor 31 on the upper side and the opening of the through hole 40 on the upper side substantially equal each other. Also, the end face of the conductor 31 on the lower side and the opening of the through hole 40 on the lower side substantially equal each other. The conductive films 21 and 24 are electrically connected to each other through the conductor 31.

Preferably, the conductor 31 and the conductive films 21, 23, 24 are formed by screen printing. In order for the through hole 40 to be filled with the conductor 31 favorably, the through hole 40 is filled with the conductor 31 before forming the functional layer 11 with the conductive films 21, 23, 24. The conductor 31 and the conductive films 21, 23, 24 are electrically conductive. Each of the conductor 31 and conductive films 21, 23, 24 can be constituted by a Pd—Ag alloy having a Pd/Ag ingredient ratio of 3/7, for example.

The through hole 40 has a major axis diameter and a minor axis diameter on the upper and lower sides. As a consequence, the conductor 31 has a major axis diameter and a minor axis diameter at each of the end faces on the upper and lower sides. The opening of the through hole 40, i.e., the end face of the conductor 31, on only one of the upper and lower sides may have a major axis diameter and a minor axis diameter as well. Examples of the form having a major axis diameter and a minor axis diameter include elliptical forms and rectangular forms with rounded corners.

The opening of the through hole 40 on each of the upper and lower sides, i.e., the end face on each of the upper and lower sides, has semicircular sides opposing each other in the major axis direction y, and linear sides opposing each other in the minor axis direction x. Specifically, the end face of the conductor 31 on the upper side (the opening of the through hole 40 on the upper side) has a form in which a semicircle having a diameter identical to the minor axis diameter D4 is connected to each of both ends of a rectangle whose two sides are the minor axis diameter D4 and a line D7. Namely, this form satisfies the relationship of $$D3 = D4 + D7.$$

Preferably, the end face of the conductor 31 on the upper face side (the opening of the through hole 40 on the upper side) satisfies the relationship of $$1 < \alpha 2 \leq 5$$

where $\alpha 2$ is the ratio (D3/D4) between the major axis diameter D3 and the minor axis diameter D4. This is because of the fact that, when $\alpha 2 > 5$, the laser beam energy at an end part in the major axis direction may be insufficient, so that the laser beam may fail to penetrate through the functional layer 11 (substrate 10) at this end part. Further, in view of the fact that the length of the active part of a piezoelectric body may be more restricted as the major axis diameter D3 is longer when used as the piezoelectric device, for example, the end face preferably satisfies the relationship of $$\alpha 2 \leq 3,$$

more preferably $$\alpha 2 \leq 2.$$

Specifically, in FIGS. 1 and 2, D3=60 µm, and D4=50 µm.

In the conductive film 24, the length D0 seen in the minor axis direction of the conductor 31 (through hole 40) satisfies the relationship of $$D0 > D4.$$

Preferably, it satisfies the relationship of $$0.1 \, D0 \leq D4 \leq 0.95 \, D0.$$

On the other hand, the length D0 preferably satisfies the relationship of $$D0 \leq 200 \, \mu m.$$

More preferably, it satisfies the relationship of $$10 \, \mu m \leq D0 \leq 100 \, \mu m.$$

Further preferably, it satisfies the relationship of $$10 \, \mu m \leq D0 \leq 80 \, \mu m.$$

Specifically, D0=100 µm, for example.

The conductor 31 (through hole 40) is tapered (like a truncated cone). The end face of the conductor 31 on the upper side (the opening of the through hole 40 on the upper side) is similar to the end face of the conductor 31 on the lower side (the opening of the through hole 40 on the lower side). In this specification, the word "similar" refers not only to mathematically completely similar forms but also to those somewhat distorted upon firing and the like. Not only a solid conductor but also a hollow conductor is sufficient as the conductor 31.

Letting D5 be the minor axis diameter of the end face of the conductor 31 on the lower side (the opening of the through hole 40 on the lower side), and $\alpha 1$ be the ratio between the minor axis diameter D5 and the minor axis diameter D4 of the upper face (D5/D4), $\alpha 1$ preferably satisfies the relationship of $$0.4 \leq \alpha 1 \leq 0.94.$$

Specifically, D5=30 µm. In this case, $\alpha 1=0.6$, thus satisfying the above-mentioned conditional expression concerning $\alpha 1$.

In the first embodiment, as mentioned above, the electronic component EC1 includes the substrate 10. In the substrate 10, the conductive films 21 and 23, 24 are arranged with a gap therebetween extending in the thickness direction of the substrate 10. In this case, the electronic component EC1 can construct piezoelectric devices such as laminated actuators, and electronic components such as chip capacitors, chip inductors, and chip composite electronic components. The subject electronic components may have a single-layer structure or multilayer laminate structure.

In the first embodiment, the conductor 31 (through hole 40) penetrates through the substrate 10 (functional layer 11) in its thickness direction. Hence, the conductor 31 can electrically connect the conductive films 21 and 24, which are arranged with a gap therebetween extending in the thickness direction of the substrate 10, to each other.

Since the end face of the conductor 31 on each of the upper and lower sides (the opening of the through hole 40 on each of the upper and lower sides) has a major axis diameter and a minor axis diameter, the width in the minor axis direction x is shorter in the first embodiment than in the conductor (through hole) in the conventional electronic component having the same area (opening area). This makes it possible to provide the conductor 31 (through hole 40) in a very narrow space, thus contributing to reducing the size of the electronic component EC1.

In the first embodiment, even when the width in the minor axis direction x is the same as the diameter (opening diameter) of the conductor (through hole) in the conventional electronic component, the width in the major axis direction y is greater, thus increasing the area of the end face of the conductor 31 on each of the upper and lower sides (the opening of the through hole 40 on each of the upper and lower sides). This improves the reliability in electric connection effected by the conductor 31 and conductive films 21, 24, thereby increasing the yield.

Specifically, in the case of a conventional cylindrical or truncated conical through hole, the opening area of the through hole on the upper side is $$\Pi \times (D/2)^2$$

where D is the diameter. The opening area of the through hole on the lower side is expressed in the same manner.

In the electronic component EC1 in accordance with the first embodiment, by contrast, the opening of the through hole 40 on each of the upper and lower sides has a major axis diameter D3 and a minor axis diameter D4, whereby the opening area of the through hole 40 on the upper side is $$\Pi \times (D4/2)^2 + (D4 \times D7).$$

Therefore, if the minor axis diameter D4 equals the diameter D of the conventional cylindrical or truncated conical through hole, the area of the through hole in the electronic component EC1 becomes greater than that in the conventional example by $$D4 \times D7.$$

Also, by narrowing the conductor 31 (through hole 40), the electronic component EC1 in accordance with the first embodiment can increase the effective area used for forming the conductive film 23 and other electronic devices, thereby contributing to achieving a higher density. In this embodiment, not only the end face of the conductor 31 on the upper side (the opening of the through hole 40 on the upper side), but also the end face of the conductor 31 on the lower side (the opening of the through hole 40 on the lower side) has a major axis diameter and a minor axis diameter. This yields results better than those in the case where the end face (opening) on only one of the upper and lower sides has a major axis diameter and a minor axis diameter.

The through hole 40 is tapered (like a truncated cone) such that the minor axis diameter D4 of the opening on the upper side is greater than the minor axis diameter D5 of the opening on the lower side, and thus can be filled with a conductor paste more favorably. This can also prevent the paste from discontinuing at a corner on the upper side of the through hole 40 upon drying and thereby disconnecting the conductor 31 from the conductive film 24. Hence, the yield improves.

Figure 3:
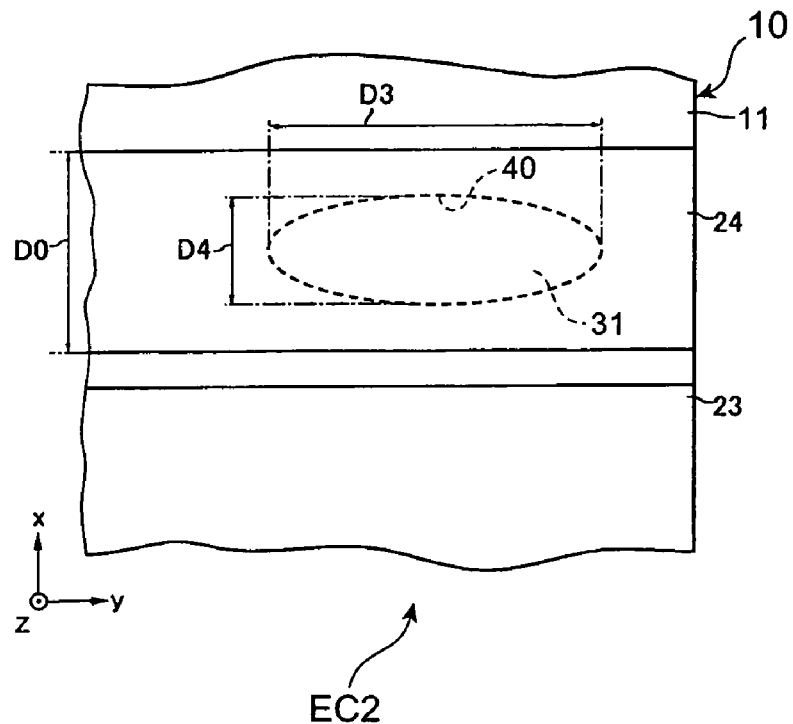
FIG. 3 is a plan view showing a modified example of the electronic component in accordance with the first embodiment.
Figure 4:
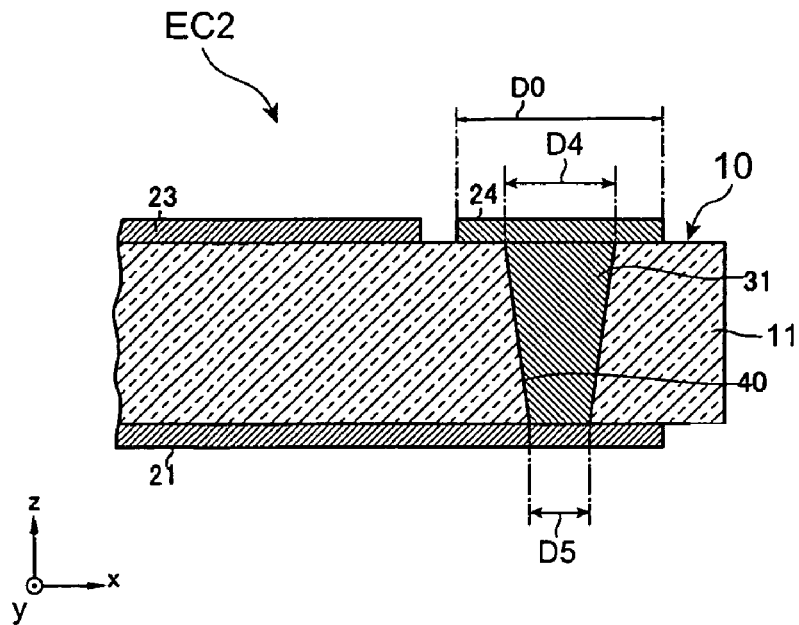
FIG. 4 is a sectional view showing the modified example of the electronic component in accordance with the first embodiment.

A modified example of the electronic component in accordance with the first embodiment will now be explained with reference to FIGS. 3 and 4. FIG. 3 is a plan view showing the modified example of the electronic component in accordance with the first embodiment. FIG. 4 is a sectional view of the modified example of the electronic component in accordance with the first embodiment. Words "upper" and "lower" used in the explanation correspond to the upward and downward directions in FIG. 4, respectively.

The electronic component EC2 shown in FIGS. 3 and 4 differs from the electronic component EC1 in accordance with the first embodiment in the end face forms of the conductor 31 on the upper and lower sides (the opening forms of the through hole 40 on the upper and lower sides). In the electronic component EC2, the end face form of the conductor 31 on each of the upper and lower sides (the opening form of the through hole 40 on each of the upper and lower sides) is elliptical as shown in FIGS. 3 and 4.

As with the above-mentioned electronic component EC1, the electronic component EC2 makes it possible to provide the conductor 31 (through hole 40) in a very narrow space, thus contributing to reducing the size of the electronic component EC1. This also improves the reliability in electric connection effected by the conductor 31 and conductive films 21, 24, thereby increasing the yield.

Second Embodiment

Figure 5:
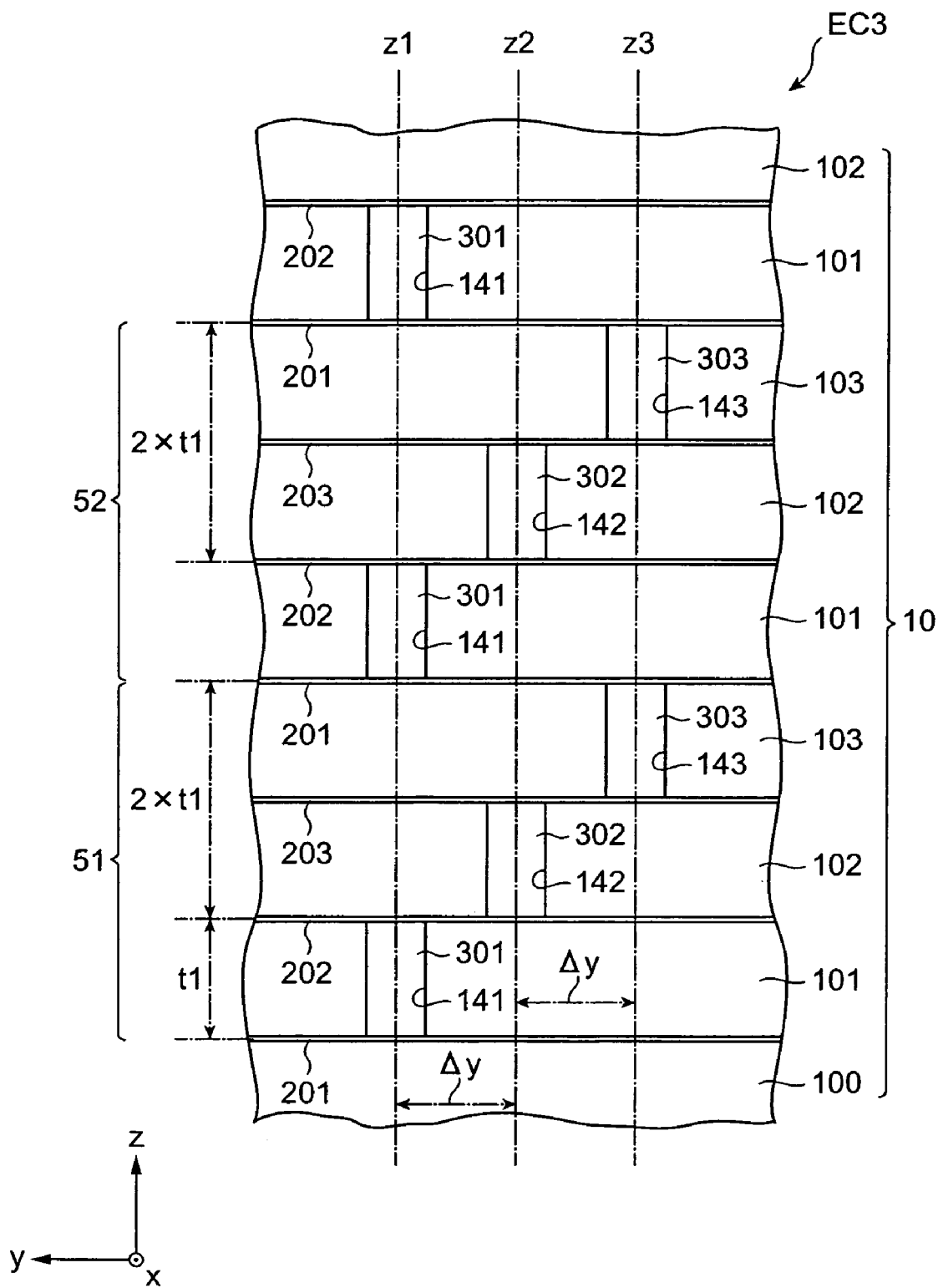
FIG. 5 is a schematic view showing the electronic component in accordance with a second embodiment.
Figure 6:
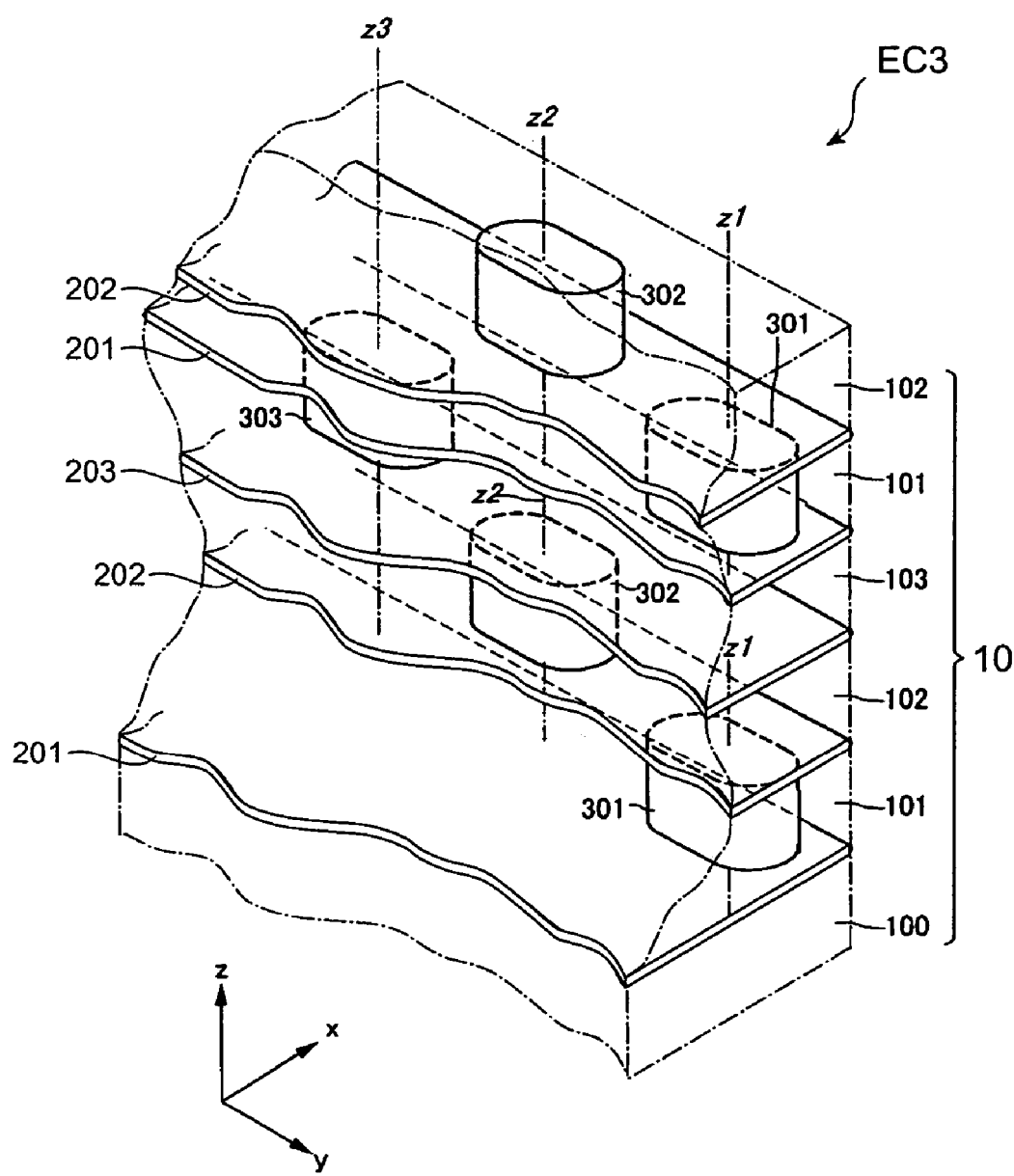
FIG. 6 is a schematic perspective view showing the electronic component in accordance with the second embodiment.
Figure 7:
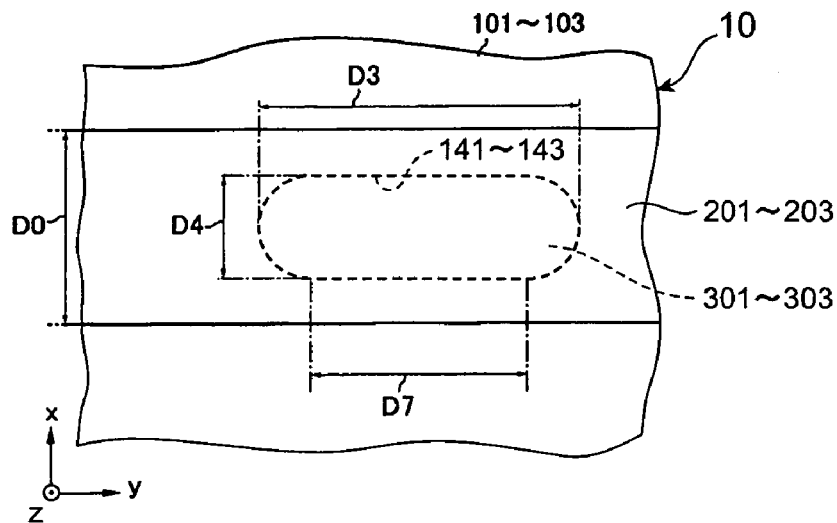
FIG. 7 is a plan view showing a conductor (through hole) and its vicinity in the electronic component in accordance with the second embodiment.

FIG. 5 is a schematic view showing the electronic component in accordance with the second embodiment. FIG. 6 is a schematic perspective view showing the electronic component in accordance with the second embodiment. FIG. 7 is a plan view showing a conductor (through hole) and its vicinity in the electronic component in accordance with the second embodiment. Words "upper" and "lower" used in the explanation correspond to the upward and downward directions in FIGS. 5 and 9, respectively.

As shown in FIGS. 5 to 7, this electronic component EC3 comprises a substrate 10, a plurality of conductive films (electrode films) 201 to 203, and a plurality of conductors 301 to 303.

The conductive films 201 to 203 are buried in the substrate 10. A part of the conductive films 201 to 203 may be formed on the surface of the substrate 10. In the substrate 10, substrate parts existing between the adjacent conductive films 201 to 203 become functional layers 101 to 103, respectively.

The functional layers 101 to 103 (substrate 10) are formed with through holes 141 to 143 penetrating therethrough in the thickness direction thereof. Thus, a plurality of through holes 141 to 143 are arranged in the substrate 10 along its thickness direction. Also, the through holes 141 to 143 are formed such that their major axis directions extend along the longitudinal directions of the conductive films 201 to 203, respectively.

Each of the through holes 141 to 143 can be formed by using a laser beam. The forms of the through holes 141 to 143 can easily be set by adjusting the form of a mask. As the laser beam, harmonics of YAG can be used, for example. Preferably, the laser beam has a wavelength of at least 193 nm but not longer than 532 nm. When the wavelength is at least 193 nm but not longer than 532 nm, it becomes easier to control the through hole diameter, whereby through holes having a favorable quality can be formed with high efficiency. This can also reduce the processing residue occurring when forming through holes.

The functional layers 101 to 103 may have the same thickness or different thicknesses. Each of the functional layers 101 to 103 preferably has a thickness t2 of 1 µm≦t2≦100 µm, more preferably 5 µm≦t2≦50 µm.

The conductive films 201 to 203 are formed on respective one surfaces (upper or lower faces) of their corresponding functional layers 101 to 103. The conductive films 201 to 203 are positioned with intervals extending in the thickness direction z of the functional layers 101 to 103.

The conductors 301 to 303 electrically connect one surface side and the other surface side of their corresponding functional layers 101 to 103 (substrate 10). The conductors 301 to 303 fill their corresponding through holes 141 to 143. As a consequence, the end face forms of the conductors 301 to 303 on the upper side substantially equal the opening forms of the through holes 141 to 143 on the upper side, respectively. Also, the end face forms of the conductors 301 to 303 on the lower side substantially equal the opening forms of the through holes 141 to 143 on the lower side, respectively. The conductive films 201 and 202 are electrically connected to each other by the conductor 301. The conductive films 202 and 203 are electrically connected to each other by the conductor 302. The conductive films 203 and 201 are electrically connected to each other by the conductor 303.

Preferably, the conductors 301 to 303 and the conductive films 201 to 203 are formed by screen printing. In order for the through holes 141 to 143 to be filled with the conductors 301 to 303 favorably, the through holes 141 to 143 are filled with the conductors 301 to 303 before forming the functional layers 141 to 143 with the conductive films 201 to 203. The conductors 301 to 303 and the conductive films 201 to 203 are electrically conductive. Each of the conductors

301 to 303 and conductive films 201 to 203 can be constituted by a Pd—Ag alloy having a Pd/Ag ingredient ratio of 3/7, for example.

Each of the through holes 141 to 143 has a major axis diameter and a minor axis diameter on each of the upper and lower sides. As a consequence, each of the conductors 301 to 303 has a major axis diameter and a minor axis diameter at each of the end faces on the upper and lower sides. The opening form of each of the through holes 141 to 143, i.e., the end face form of each of the conductors 301 to 303, may have a major axis diameter and a minor axis diameter on only one of the upper and lower sides as well. Examples of the form having a major axis diameter and a minor axis diameter include elliptical forms and rectangular forms with rounded corners.

As in the above-mentioned through hole 40, the opening of the through holes 141 to 143 on each of the upper and lower sides, i.e., the end face on each of the upper and lower sides, has semicircular sides opposing each other in the major axis direction y, and linear sides opposing each other in the minor axis direction x. Specifically, the end face of each of the conductors 301 to 303 on the upper side (the opening of each of the through holes 141 to 143 on the upper side) has a form in which a semicircle having a diameter identical to the minor axis diameter D4 is connected to each of both ends of a rectangle whose two sides are the minor axis diameter D4 and a line D7. Namely, this form satisfies the relationship of $$D3 = D4 + D7.$$

Preferably, the end face of each of the conductors 301 to 303 on the upper face side (the opening of each of the through holes 141 to 143 on the upper side) satisfies the relationship of $$1 < \alpha 2 \leq 5$$

where α2 is the ratio (D3/D4) between the major axis diameter D3 and the minor axis diameter D4. This is because of the fact that, when α2>5, the laser beam energy at an end part in the major axis direction may be insufficient, so that the laser beam may fail to penetrate through the functional layers 101 to 103 (substrate 10) at this end part. Further, in view of the fact that the length of the active part of a piezoelectric body may be more restricted as the major axis diameter D3 is longer when used as the piezoelectric device, for example, the end face preferably satisfies the relationship of $$\alpha 2 \leq 3,$$

more preferably $$\alpha 2 \leq 2.$$

Specifically, in FIG. 7, D3=60 μm, and D4=50 μm.

In the conductive films 201 to 203, the length D0 seen in the minor axis direction of the conductors 301 to 303 (through holes 141 to 143) satisfies the relationship of $$D0 > D4.$$

Preferably, it satisfies the relationship of $$0.1\ D0 \leq D4 \leq 0.95 D0.$$

On the other hand, the length D0 preferably satisfies the relationship of $$D0 \leq 500\ \mu m.$$

More preferably, it satisfies the relationship of $$10\ \mu m \leq D0 \leq 200\ \mu m.$$

Further preferably, it satisfies the relationship of $$10\ \mu m \leq D0 \leq 150\ \mu m.$$

Specifically, D0=200 μm.

In the electronic component EC3 in this embodiment, the conductors 301 to 303 and functional layers 101 to 103 constitute groups 51, 52. Though FIG. 5 shows only two groups 51, 52, any number of groups can be provided. A given number of groups are laminated repeatedly.

The conductors 301 to 303 (through holes 141 to 143) included in each of the groups 51, 52 are arranged on three center axes z1 to z3 extending along the thickness direction z of the substrate 10 (hereinafter referred to as "3-axis arrangement"). Specifically, the conductors 301 and 302 (through holes 141 and 142) adjacent each other, the conductors 302 and 303 (through holes 142 and 143) adjacent each other, and the conductors 303 and 301 (through holes 143 and 141) adjacent each other as seen in the thickness direction of the substrate 10 are disposed such that at least their center axes z1 to z3 do not overlap each other as seen in the minor axis direction x orthogonal to the thickness direction z of the substrate 10.

Here, the end faces of the conductors 301 to 303 (the openings of the through holes 141 to 143) are allowed to partially overlap each other as seen in the thickness direction z of the substrate 10. Preferably, as shown in FIGS. 5 and 6, the conductors 301 to 303 (through holes 141 to 143) are arranged such that their end faces (openings) do not overlap each other as seen in the thickness direction z of the substrate 10.

In the electronic component EC3, each of the groups 51, 52 is repeatedly arranged at the same position as seen in the thickness direction z of the substrate 10. The respective conductors 301 in the groups 51 and 52 corresponding to each other yield a gap (2×t1) therebetween. Similarly, the respective conductors 302 in the groups 51 and 52 corresponding to each other yield a gap (2×t1) therebetween, whereas the respective conductors 303 in the groups 51 and 52 corresponding to each other yield a gap (2×t1) therebetween.

The conductors 301 to 303 (through holes 141 to 143) are repeatedly arranged with a periodicity as seen in the thickness direction of the substrate 10. The conductors 302 (through holes 142) are disposed at a position separated by Δy from the conductors 301 (through holes 141) in the direction y orthogonal to the thickness direction z. The conductors 303 (through holes 143) are disposed at a position separated by 2×Δy from the conductors 301 (through holes 141) in the direction y.

As explained above, the EC3 includes the substrate 31 and a plurality of conductive films 201 to 203 in the second embodiment. The plurality of conductive films 201 to 203 are buried in the substrate 10 with gaps therebetween extending in the thickness direction of the substrate 10. In this case, the electronic component EC3 can construct piezoelectric devices such as laminated actuators, and electronic components such as chip capacitors, chip inductors, and chip composite electronic components by choosing the material for constituting the substrate 10 as appropriate.

In the second embodiment, the conductors 301 to 303 (through holes 141 to 143) penetrate through the substrate 10 (functional layers 101 to 103). Therefore, the conductors 301 to 303 can electrically connect the conductive films 201 to 203 arranged in the substrate 10 with gaps therebetween extending in its thickness direction. Also, in this structure, the positioning is not required to be as accurate as that in the case where the conductors are directly connected to each other, i.e., where the conductors (through holes) are arranged such that their center axes are positioned on a single axis (hereinafter referred to as "uniaxial arrangement"), whereby the electronic component EC3 can be made more easily.

Also, the connection between the conductors 301 to 303 and the conductive films 201 to 203 becomes stronger than that in the case where the conductors are directly connected to each other, thereby increasing the reliability in connection and the yield.

When firing the electronic component EC3 in the final step of making the same and the like in particular, the conductive films 201 to 203 and the conductors 301 to 303 can be kept from failing to connect with each other because of the difference in coefficient of contraction between the conductive films 201 to 203 and conductors 301 to 303 and the functional layers 101 to 103 constituting the substrate 10. Similarly, when temperature changes while the finished product is in use, the conductive films 201 to 203 and the conductors 301 to 303 can be kept from failing to connect with each other because of the difference in coefficient of expansion between the conductive films 201 to 203 and conductors 301 to 303 and the functional layers 101 to 103. As a consequence, the yield and reliability of the electronic component EC3 improve.

Since the positioning becomes easier while the reliability in connection effected by the conductors 301 to 303 improves as explained above, the conductors 301 to 303 can reduce their diameter. Hence, the electronic component EC3 can be made smaller.

As the conductors 301 to 303 are made with a smaller diameter, the effective area where the conductive films 201 to 203 and the like can be formed increases in the functional layers 101 to 103. This allows the electronic component EC3 to attain a higher density and improved characteristics.

In the second embodiment, each of the end faces of the conductors 301 to 303 on the upper and lower sides (each of the openings of the through holes 141 to 143 on the upper and lower sides) has a major axis diameter and a minor axis diameter, whereby the width in the minor axis direction x becomes narrower than that in the above-mentioned conventional electronic component when they have the same area (opening area). As a consequence, the conductors 301 to 303 (through holes 141 to 143) can be provided in a very narrow space, thus contributing to reducing the size of the electronic component EC3.

In the second embodiment, even when the width in the minor axis direction x is the same as the diameter (opening diameter) of the conductor (through hole) in the above-mentioned conventional through hole, the width in the major axis direction y is greater, whereby the area of each of the end faces of the conductors 301 to 303 on the upper and lower sides (the openings of the through holes 141 to 143 on the upper and lower sides) increases. As a consequence, the reliability in connection effected by the conductors 301 to 303 provided in the through holes 141 to 143 improves, and the yield increases.

By narrowing the conductors 301 to 303 (through holes 141 to 143), the electronic component EC3 in accordance with the second embodiment can increase the effective area used for forming the conductive films 201 to 203 and other electronic devices, thereby contributing to attaining a higher density. In the second embodiment, not only the end faces of the conductors 301 to 303 on the upper side (the openings of the through holes 141 to 143 on the upper side) but also their end faces on the lower side have a major axis diameter and a minor axis diameter. This yields results better than those in the case where only the end faces (openings) on only one of the upper and lower sides have a major axis diameter and a minor axis diameter.

In the second embodiment, a plurality of conductors 301 to 303 (through holes 141 to 143) are arranged along the thickness direction z of the substrate 10 such that their center axes z1 to z3 deviate from each other as seen in a direction orthogonal to the thickness direction z of the substrate 10. Namely, the conductors 301 to 303 (through holes 141 to 143) are disposed on at least three axes z2 to z3 parallel to the thickness direction z of the substrate 10. It has been verified that such a configuration can improve the reliability in electric connection between the conductors 301 to 303 and the conductive films 201 to 203 as compared with the conventional uniaxial arrangement and biaxial arrangement (in which conductors (through holes) are disposed on two axes such that their center axes deviate from each other) The reason why the reliability in electric connection between the conductors 301 to 303 and the conductive films 201 to 203 can be improved seems to be because of the fact that the configuration in which the conductors 301 to 303 (through holes 141 to 143) are disposed on the respective axes z1 to z3 reduces distortions of the substrate 10 occurring at the time of making the electronic component EC3 (e.g., laminating, pressing, and firing), whereby the through holes 141 to 143 are restrained from deforming.

The following are considered to be reasons why distortions of the substrate 10 can be reduced when the conductors 301 to 303 (through holes 141 to 143) are disposed on the respective axes z1 to z3.

The first reason will now be explained. Distortions may occur in the functional layers 101 to 103 in their parts formed with the conductors 301 to 303 (through holes 141 to 143). When the conductors 301 to 303 are disposed on the respective axes z1 to z3, however, the distortions in the parts formed with the conductors 301 to 303 (through holes 141 to 143) are dispersed. As a consequence, the distortions in the parts formed with the conductors 301 to 303 (through holes 141 to 143) cancel each other, thereby alleviating the distortions in the substrate 10 as a whole.

The second reason will now be explained. The respective conductors 301 included in the groups 51 and 52 are disposed with a gap therebetween not smaller than a thickness (2×t1). Also, the respective conductors 302 included in the groups 51 and 52 are disposed with a gap therebetween not smaller than a thickness (2×t1). Similarly, the respective conductors 303 included in the groups 51 and 52 are disposed with a gap therebetween not smaller than a thickness (2×t1). Therefore, even when distortions are generated in connecting parts between the conductors 301 to 303 and the conductive films 201 to 203, the distortions are dispersed by the thickness (2×t1) existing between the conductors 301, 301, between the conductors 302, 302, and between the conductors 303, 303, whereby the substrate 10 as a whole reduces its distortions.

The second embodiment may be configured such that the conductive films 201 to 203 buried in the substrate 10 are drawn onto the upper or lower side of the substrate 10 through the conductors 301 to 303 so as to be connected to terminal electrodes (not depicted) formed on the upper or lower side. In this case, the electronic component EC3 constructs a surface-mount type electronic component (SMD).

Figure 8:
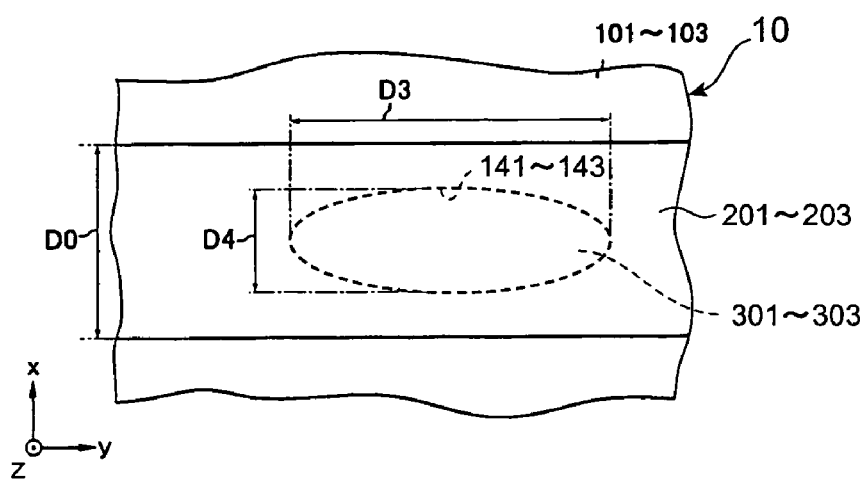
FIG. 8 is a plan view showing a modified example of the electronic component in accordance with the second embodiment.

In the second embodiment, the end faces of the conductors 301 to 303 on the upper and lower sides (the openings of the through holes 141 to 143 on the upper and lower sides) may have an elliptical form as shown in FIG. 8. The conductors 301 to 303 (though holes 141 to 143) can be disposed in a very narrow space, thus contributing to reducing the size of the electronic component EC3 in this case as well. This improves the reliability in electric connection between the conductors 301 to 303 and conductive films 201 to 203, and increases the yield.

Figure 9:
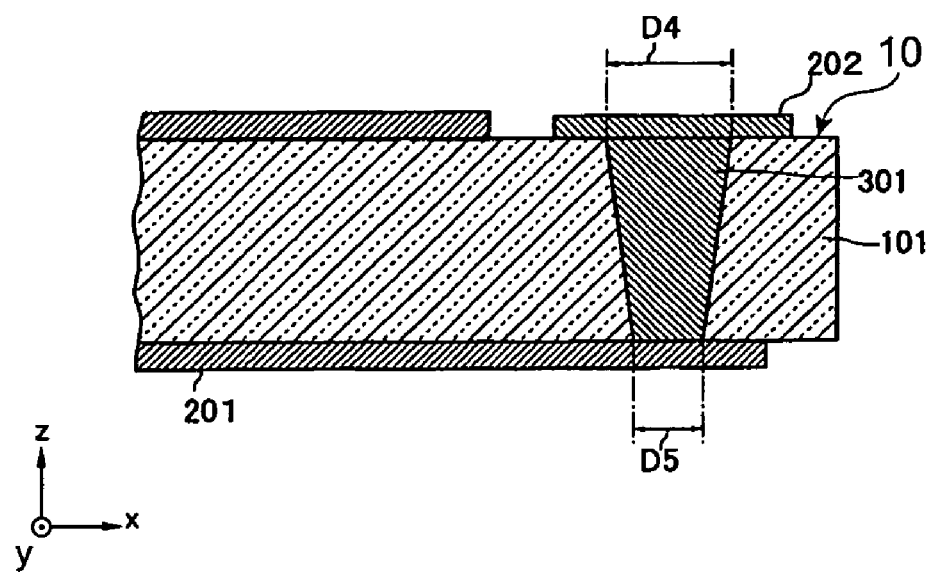
FIG. 9 is a sectional view of the modified example of the electronic component in accordance with the second embodiment.

In the second embodiment, as shown in FIG. 9, the conductors 301 to 303 (through holes 141 to 143) may be tapered (like a truncated cone) as with the above-mentioned conductor 31 (through hole 40). Also, the end faces of the conductors 301 to 303 on the upper side (the openings of the through holes 141 to 143 on the upper side) may be made similar to those on the lower side. Not only a solid conductor but also a hollow conductor is sufficient as each of the conductors 301 to 303.

Letting D5 be the minor axis diameter of the end faces of the conductors 301 to 303 on the lower side (the openings of the through hole 141 to 143 on the lower side), and $\alpha 1$ be the ratio between the minor axis diameter D5 and the minor axis diameter D4 of their upper faces (D5/D4), $\alpha 1$ preferably satisfies the relationship of $$0.4 \leq \alpha 1 \leq 0.94.$$

Specifically, D5=40 μm. In this case, $\alpha 1$=0.8, thus satisfying the above-mentioned conditional expression concerning $\alpha 1$.

The through holes 141 to 143 are tapered (like a truncated cone) such that the minor axis diameter D4 of the openings on the upper side is greater than the minor axis diameter D5 of the openings on the lower side, and thus can be filled with a conductor paste more favorably. This can also prevent the paste from discontinuing at a corner on the upper side of the through holes 141 to 143 upon drying and thereby disconnecting the conductors 301 to 303 from the conductive films 201 to 203. Hence, the yield improves.

Figure 10:
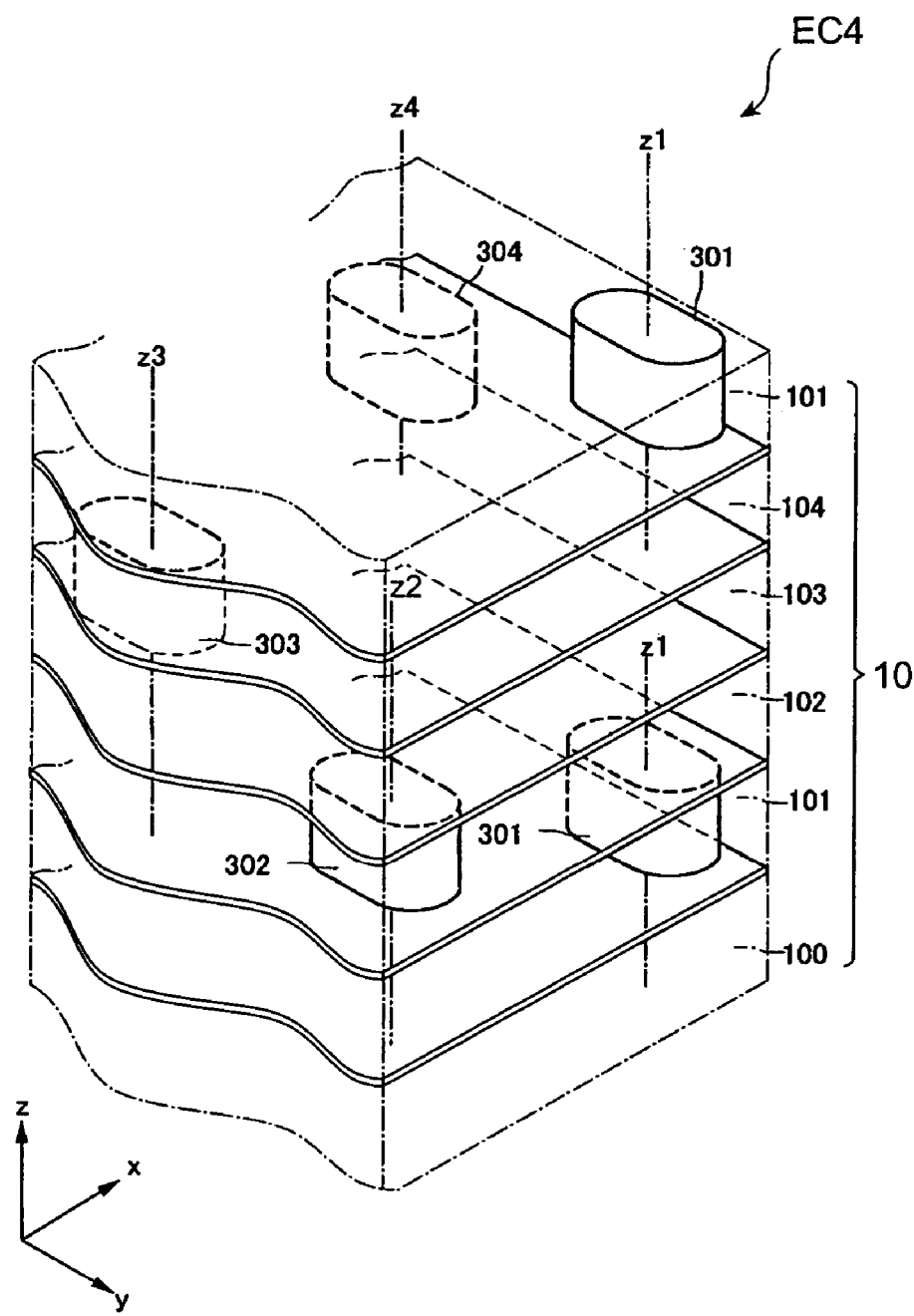
FIG. 10 is a schematic perspective view showing the modified example of the electronic component in accordance with the second embodiment.

With reference to FIG. 10, a modified example of the electronic component in accordance with the second embodiment will now be explained. FIG. 10 is a schematic perspective view showing the modified example of the electronic component in accordance with the second embodiment.

The electronic component EC4 shown in FIG. 10 differs from the electronic component EC3 in accordance with the second embodiment in the arrangement of conductors. In the electronic component EC4, as shown in FIG. 10, conductors 301 to 304 (through holes, not depicted) are respectively disposed on four center axes z1 to z4 extending along the thickness direction z of the substrate 10 (hereinafter referred to as "4-axis arrangement"). The conductors 301 to 304 (through holes) are periodically arranged clockwise about the thickness direction z of the substrate 10.

As with the electronic component EC3, the electronic component EC4 can improve the reliability in electric connection between the conductors 301 to 303 and the conductive films 201 to 203.

Third Embodiment

Figure 11:
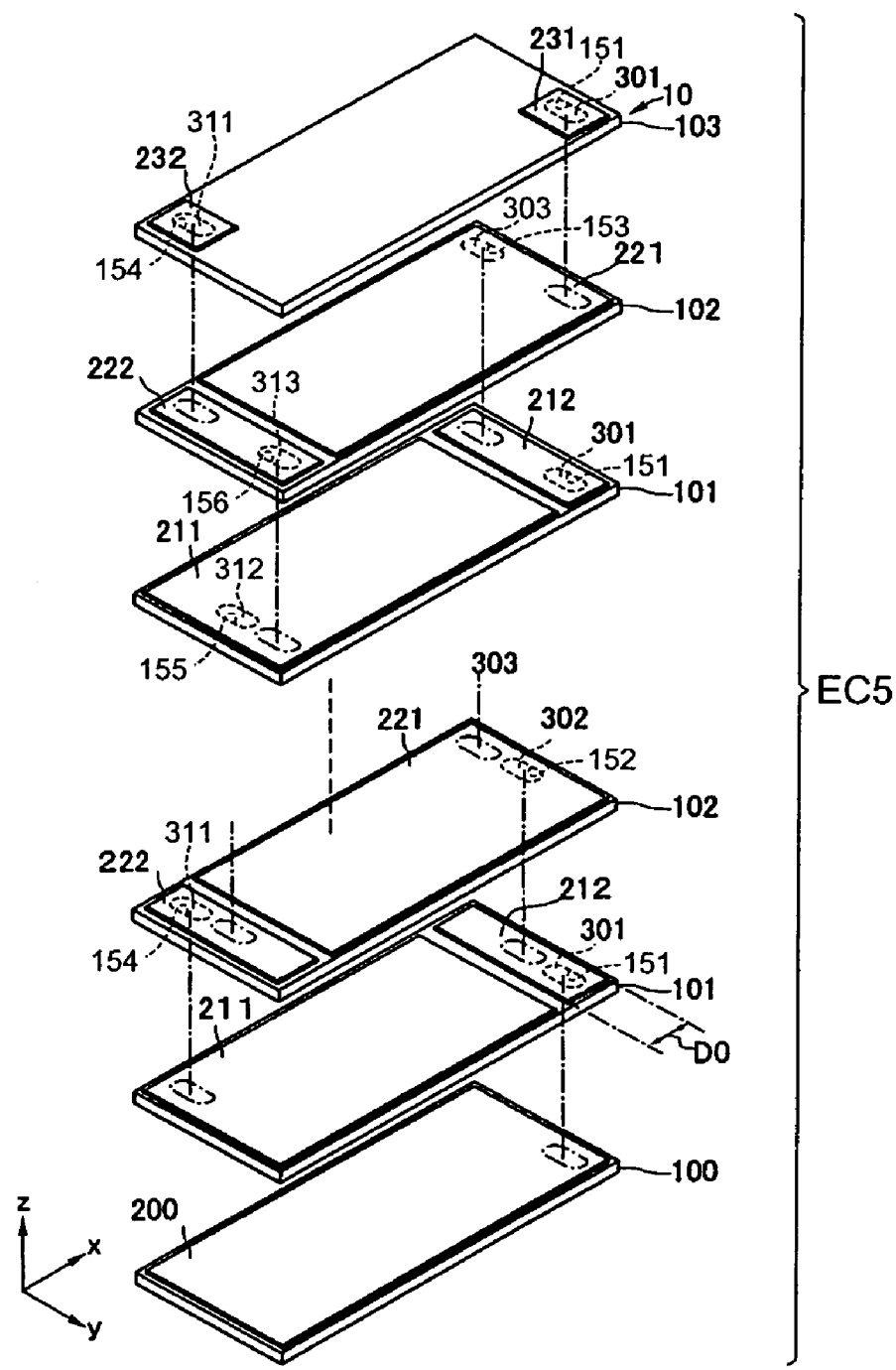
FIG. 11 is an exploded perspective view showing the electronic component in accordance with a third embodiment.
Figure 12:
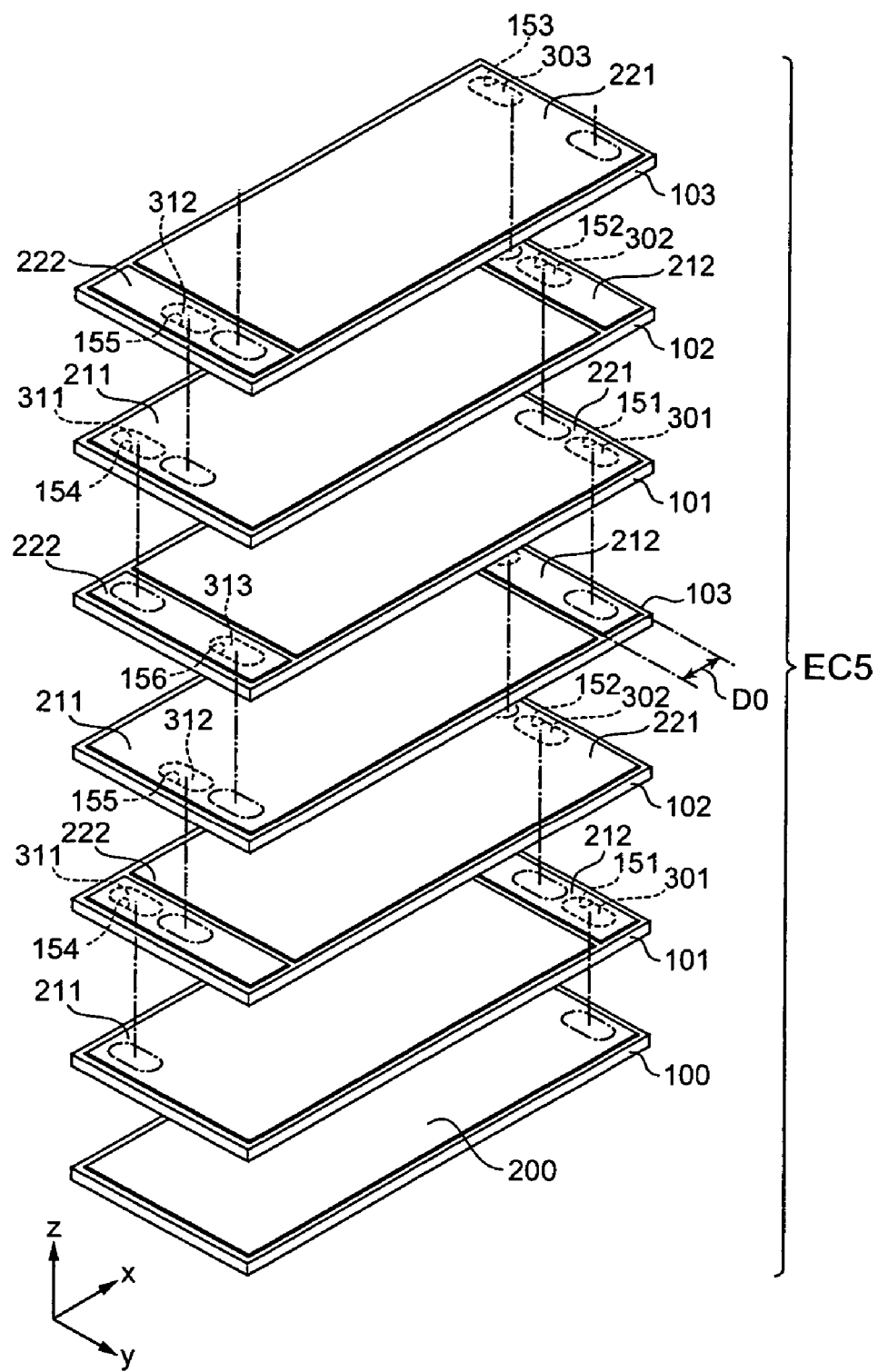
FIG. 12 is an exploded perspective view showing a part of the electronic component shown in FIG. 11.
Figure 13:
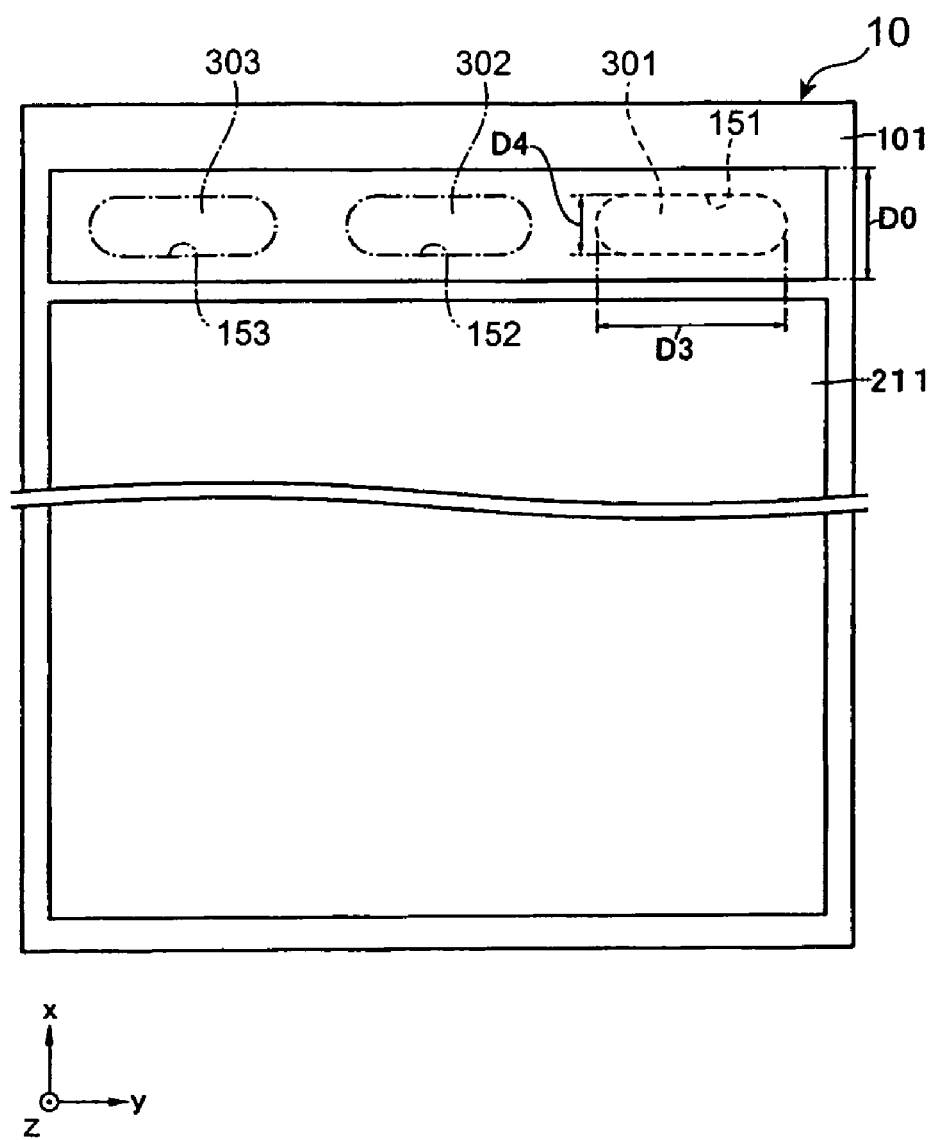
FIG. 13 is a plan view showing a part of the electronic component shown in FIGS. 11 and 12.

FIG. 11 is an exploded perspective view showing the electronic component in accordance with the third embodiment. FIG. 12 is an exploded perspective view showing a part of the electronic component shown in FIG. 11. FIG. 13 is a plan view showing a part of the electronic component shown in FIGS. 11 and 12. Here, FIGS. 11 and 12 show the electronic component EC5 in accordance with the third embodiment in a state divided for explanation, but do not indicate that the electronic component EC5 has a laminate structure decomposed as depicted. Words "upper" and "lower" used in the explanation correspond to the upward and downward directions in FIG. 11, respectively.

As shown in FIGS. 11 and 12, the electronic component EC5 comprises a substrate 10; electrode films 200, 210, 220, 231, 232; and conductors 301 to 303, 311 to 313. This electronic component EC5 is an actuator including a firing step in its making process. The electronic component EC5 has a size of 6 mm×1.2 mm×0.64 mm, for example, after firing.

The substrate 10 is constituted by a material mainly composed of a piezoelectric ceramic, and has a lowermost layer 100 and functional layers 101 to 103. The substrate 10 has a configuration in which a desired number of laminate groups each comprising the functional layers 101, 102, 103 laminated in this order are stacked. Each of the functional layers 101 to 103 has a thickness t1 of 30 μm, for example. The electrode film 200 is positioned at the interface between the lowermost layer 100 and the functional layer 101.

The electrode film 210 includes a first electrode film 211 and a first terminal electrode film 212. The electrode film 220 includes a second electrode film 221 and a second terminal electrode film 222. The first electrode film 211 and second electrode film 221 are electrodes involved in vibrations, whereas the first terminal electrode film 212 and second terminal electrode film 222 are electrodes not involved in vibrations. Therefore, a part where the first electrode film 211 and second electrode film 221 overlap each other becomes a part to be displaced as an actuator (active region).

The first electrode film 211 and the first terminal electrode film 212 are disposed at the same position as seen in the thickness direction z of the substrate with a first insulating gap therebetween. The second electrode film 221 and the second terminal electrode film 222 are disposed at the same position as seen in the thickness direction z of the substrate with a second insulating gap therebetween.

The second electrode film 221 opposes the first electrode film 211 and first terminal electrode film 212 by way of the functional layer 102 (substrate 10). The second terminal electrode film 222 opposes the first electrode film 211 by way of the functional layer 102 (substrate 10). Similarly, the first electrode film 211 opposes the second electrode film 221 and second terminal electrode film 222 by way of the functional layer 102 (substrate 10), whereas the first terminal electrode film 212 opposes the second electrode film 221 by way of the functional layer 102 (substrate 10). Groups constituted by the first electrode film 211 and first terminal electrode film 212 and groups constituted by the second electrode film 221 and second terminal electrode film 222 are disposed alternately with a gap therebetween extending in the thickness direction of the functional layers 101 to 103 (substrate 10).

The functional layers 101 to 103 (substrate 10) have through holes 151 to 156 penetrating therethrough in the thickness direction thereof at end parts in their longer side direction. As a consequence, a plurality of through holes 151 to 156 are arranged in the substrate 10 along the thickness direction thereof. The through holes 151 to 153 are formed such that their major axis direction extends along the longitudinal direction of the second terminal electrode film 222.

As with the through holes 141 to 143 in the second embodiment, each of the through holes 151 to 156 can be formed by using a laser beam.

The conductors 301 to 303, 311 to 313 electrically connect one surface side and the other surface side of their corresponding functional layers 101 to 103 (substrate 10). The conductors 301 to 303, 311 to 313 fill their corresponding through holes 151 to 156. As a consequence, the end face forms of the conductors 301 to 303, 311 to 313 on the upper side substantially equal the opening forms of the through holes 151 to 156 on the upper side, respectively. Also, the end face forms of the conductors 301 to 303, 311 to 313 on the lower side substantially equal the opening forms of the through holes 151 to 156 on the lower side, respectively.

The following are electric connections effected by the conductors 301 to 303. The electrode film 200 and the first terminal electrode film 212 are electrically connected to each other by the conductor 301. The first terminal electrode film 212 and the second electrode film 221 are electrically connected to each other by the conductor 302. The second electrode film 221 and the first terminal electrode film 212 are electrically connected to each other by the conductor 303. The first terminal electrode film 212 and the second electrode film 221 are electrically connected to each other by the conductor 301. This rule of connection is repeated in conformity to the number of laminated layers.

The conductors 301 to 303 (through holes 151 to 153) are arranged such that their center axes deviate from each other (3-axis arrangement). Specifically, the conductors 301 and 302 (through holes 151 and 152) adjacent each other are arranged so as to deviate from each other such that their end faces (openings) do not overlap as seen in the thickness direction z of the substrate 10. The conductors 302 and 303 (through holes 152 and 153) adjacent each other are arranged so as to deviate from each other such that their end faces (openings) do not overlap as seen in the thickness direction z of the substrate 10. The conductors 303 and 301 (through holes 153 and 151) adjacent each other are arranged so as to deviate from each other such that their end faces (openings) do not overlap as seen in the thickness direction z of the substrate 10.

The following are electric connections effected by the conductors 311 to 313. The first electrode film 211 and the second terminal electrode film 222 are electrically connected to each other by the conductor 311. The second terminal electrode film 222 and the first electrode film 211 are electrically connected to each other by the conductor 312. The first electrode film 211 and the second terminal electrode film 222 are electrically connected to each other by the conductor 313. The second terminal electrode film 222 and the first electrode film 211 are electrically connected to each other by the conductor 311. This rule of connection is repeated in conformity to the number of laminated layers.

The conductors 311 to 313 (through holes 154 to 156) are arranged such that their center axes deviate from each other (3-axis arrangement). Specifically, the conductors 311 and 312 (through holes 154 and 155) adjacent each other are arranged so as to deviate from each other such that their end faces (openings) do not overlap as seen in the thickness direction z of the substrate 10. The conductors 312 and 313 (through holes 155 and 156) adjacent each other are arranged so as to deviate from each other such that their end faces (openings) do not overlap as seen in the thickness direction z of the substrate 10. The conductors 313 and 311 (through holes 156 and 154) adjacent each other are arranged so as to deviate from each other such that their end faces (openings) do not overlap as seen in the thickness direction z of the substrate 10.

The electrode films 200, 210, 220, 231, 232 and the conductors 301 to 303, 311 to 313 are electrically conductive. Each of the electrode films 200, 210, 220, 231, 232 and the conductors 301 to 303, 311 to 313 can be constituted by a Pd—Ag alloy having a Pd/Ag ingredient ratio of 3/7, for example.

As shown in FIG. 13, each of the openings of the through holes 151 to 156 on the upper and lower sides has a major axis diameter and a minor axis diameter. Consequently, each of the end faces of the conductors 301 to 303, 311 to 313 on the upper and lower sides has a major axis diameter and a minor axis diameter. The openings of the through holes 151 to 156, i.e., the end faces of the conductors 301 to 303, 311 to 311, may have a major axis diameter and a minor axis diameter on one of the upper and lower sides alone. Examples of the form having a major axis diameter and a minor axis diameter include elliptical forms and rectangular forms with rounded corners.

As in the above-mentioned through holes 40, 141 to 143, each of the openings of the through holes 151 to 156 on the upper and lower sides, i.e., the end faces of the conductors 301 to 303, 311 to 313, has semicircular sides opposing each other in the major axis direction y, and linear sides opposing each other in the minor axis direction x.

The first electrode film 211 and first terminal electrode film 212 are disposed at the same position as seen in the thickness direction z of the substrate with a first insulating gap therebetween.

The topmost layer of the substrate 10 is formed with electrode films 231, 232 for external connections. The electrode film 231 is electrically connected to the conductor 301, whereas the electrode film 232 is electrically connected to the conductor 311.

For controlling vibrations, layers not contributing to the vibrations may be provided within the substrate 10. The first terminal electrode film 212 or second terminal electrode film 222 may be formed on a plane different from the first electrode film 211 or second electrode film 221.

The electronic component EC5 having the above-mentioned configuration may be made by the following process, for example.

First, ceramic green sheets composed of piezoelectric ceramics are formed. These ceramic green sheets will construct the functional layers 101 to 103. Subsequently, the through holes 151 to 156 are formed at predetermined positions of the ceramic green sheets.

Then, the through holes 151 to 156 are filled with an electrically conductive paste, so as to form the conductors 301 to 303, 311 to 313. Subsequently, the ceramic green sheets are formed with the first electrode film 211, first terminal electrode film 212, second electrode film 221, and second terminal electrode film 222. The ceramic green sheets construct the functional layers 101 to 103. Forming the conductors 301 to 303, 311 to 313 before forming the electrode films 211, 212, 221, 222 as such allows the through holes 151 to 156 to be filled favorably with an electrically conductive paste for constructing the conductors 301 to 303, 311 to 313. This can reliably connect the conductors 301 to 303, 311 to 313 to the electrode films 211, 212, 221, 222.

Next, the ceramic green sheets (functional layers 101 to 103) are successively laminated and thermally pressed so as to be bonded together under pressure. The pressure is preferably at least 50 MPa but not higher than 150 MPa. More preferably, the pressure is at least 70 MPa but not higher than 120 MPa. A pressure of 120 MPa or lower can prevent connections from failing because of deformations in the conductors 301 to 303, 311 to 313 due to pressing. A pressure of 70 MPa or higher can prevent connections from failing because of inferior adhesion between the conductors 301 to 303, 311 to 313 and the electrode films 211, 212, 221, 222.

After the thermal pressing, degreasing (debindering) is carried out. Thereafter, firing (e.g., for 3 hours at a firing temperature of 1100° C. or lower) is effected. If the firing temperature is higher, the difference in coefficient of contraction between the substrate 10 (functional layers 101 to 103) and the conductors 301 to 303, 311 to 313 becomes greater, thereby deteriorating the connection between the conductors 301 to 303, 311 to 313 and the electrode films 211, 212, 221, 222. The deterioration in connection will be quite remarkable if the Ag content is greater in the conductors 301 to 303, 311 to 313.

Since the conductors 301 to 303, 311 to 313 are disposed on their corresponding three center axes z1 to z3, however, the electronic component EC5 in accordance with the third embodiment can restrain the connection between the conductors 301 to 303, 311 to 313 and the electrode films 211, 212, 221, 222 from deteriorating even when the Ag content increases in the conductors 301 to 303, 311 to 313. This can realize a highly reliable connection structure between the conductors 301 to 303, 311 to 313 and the electrode films 211, 212, 221, 222.

After the firing, the electrode films 231, 232 are formed by such means as screen printing onto the conductors 301, 311 formed on the functional layer 103, and are burned thereon. After burning the electrode films, polarization is effected. For example, contact probes are brought into contact with the electrode films 231, 232, and a DC electric field of 4 kV per 1 mm of the functional layer thickness is applied thereto at room temperature (about 25° C.), so as to effect the polarization.

The electrode films 231, 232 may be formed not only by screen printing, but also by such means as sputtering and vapor deposition. Suitable materials for the electrode films 231, 232 include Au, Ag, Cu, Ni, and Cr, which may construct a single layer or a plurality of layers.

As in the foregoing, like the above-mentioned electronic component EC3, the electronic component EC5 in accordance with the third embodiment makes it possible to provide the conductors 301 to 303, 311 to 313 (through holes 151 to 156) within a very narrow space, thereby contributing to reducing the size of the electronic component EC5. Also, the reliability in electric connection between the conductors 301 to 303, 311 to 313 and the electrode films 200, 210, 220, 231, 232 improves, and the yield increases.

In the third embodiment, the conductors 301 to 303, 311 to 313 are disposed on their corresponding three axes z1 to z3 which are parallel to the thickness direction z of the substrate 10. Consequently, as in the above-mentioned electronic component EC3, distortions of the substrate 10 decrease in a state before the electronic component EC5 is driven as an actuator. Therefore, the electronic component EC5 (actuator) can reliably be prevented from being damaged even if a stress is applied to the substrate 10 when driving the electronic component EC5 as an actuator.

The third embodiment has a configuration in which the conductors 301 to 303, 311 to 313 (through holes 151 to 156) are disposed on their corresponding three axes z1 to z3. It also has a configuration in which the first electrode film 211 and second electrode film 221 are connected to each other by way of the first terminal electrode film 212 and second terminal electrode film 222 which are not involved with vibrations. These configurations can reduce distortions in the conductors 301 to 303, 311 to 313 (through holes 151 to 156) when the electronic component EC5 is driven as an actuator.

Effects of this embodiment will now be explained specifically with reference to experimental data.

Figure 14:
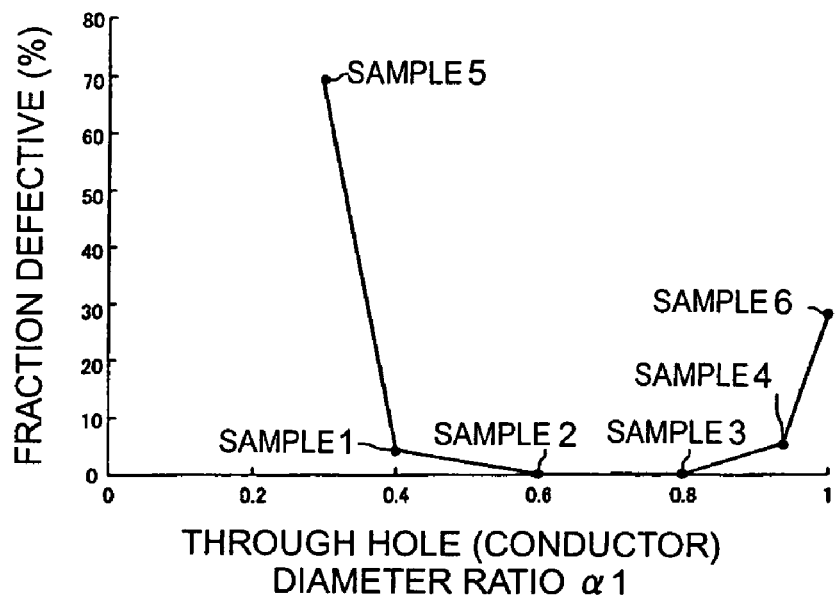
FIGS. 14 and 15 are graphs showing relationships between the through hole (conductor) diameter ratio α1 and the fraction defective.

Table 1 is a chart showing the relationship between the through hole (conductor) diameter ratio $\alpha 1(=D5/D4)$ and the fraction defective. FIG. 14 is a graph showing the relationship between the through hole (conductor) diameter ratio $\alpha 1$ and the fraction defective.

For evaluation, a plurality of samples 1 to 6 with different through hole diameter ratios $\alpha 1$ were prepared for the conductor 31 shown in FIGS. 1 and 2, and the fraction defective was calculated in 100 pieces each of the samples. In the following manner, the fraction defective was calculated. First, the capacitance value was measured with an LCR meter. Subsequently, at room temperature (about 25° C.), the capacitance value obtained after an electric field of 1 kV per 1 mm of the functional layer thickness was continuously applied for 100 hr as a sine wave of 100 kHz thereto was measured with the LCR meter. Then, the respective capacitance values obtained before and after applying the electric field were compared with each other, and the measured objects were considered defective if a significant difference was seen between these capacitance values. Thereafter, the ratio of the number of defectives per the number evaluated (100) was calculated.

Samples 1 to 4 were those in which the through hole (conductor) diameter ratio $\alpha 1$ was set such that $$0.4 \leq \alpha 1 \leq 0.94$$

as shown in Table 1 and FIG. 14. Sample 5 was set such that $$\alpha 1 < 0.4.$$

Sample 6 was set such that $$\alpha 1 > 0.94.$$

TABLE 1

|  | THROUGH HOLE DIAMETER RATIO $\alpha 1 = (D5/D4)$ | FRACTION DEFECTIVE (NUMBER OF DEFECTIVES/ NUMBEREVALUATED) |
|---|---|---|
| SAMPLE 1 | 20/50 = 0.4 | 4/100 |
| SAMPLE 2 | 30/50 = 0.6 | 0/100 |
| SAMPLE 3 | 40/50 = 0.8 | 0/100 |
| SAMPLE 4 | 47/50 = 0.94 | 5/100 |
| SAMPLE 5 | 15/50 = 0.3 | 69/100 |
| SAMPLE 6 | 50/50 = 1 | 28/100 |

When the through hole (conductor) diameter ratio $\alpha 1$ falls within the range of $0.4 \leq \alpha 1 \leq 0.94$, the fraction defective is very low as can be seen from Table 1 and FIG. 14, whereby the yield of the electronic component becomes better. The foregoing has verified the effectiveness of this embodiment.

Table 2 is a chart showing the relationship between the ratio $\alpha 2(=D3/D4)$ between the major axis diameter D3 and minor axis diameter D4 in the end face of the conductor on the upper side (the opening of the through hole on the upper side) and the fraction defective of the electronic component. Whether each electronic component was favorable or not was evaluated by determining whether or not capacity leak occurred therein due to disconnection of the conductor upon application of an electric field. First, after depolarization, the capacitance value was measured with an LCR meter. Subsequently, at room temperature (about 25° C.), the capacitance value obtained after an electric field of 1 kV per 1 mm of the functional layer thickness was continuously applied for 100 hr as a sine wave of 100 kHz thereto was measured with the LCR meter. Then, the respective capacitance values obtained before and after applying the electric field were compared with each other, and the measured objects were considered defective if a significant difference was seen between these capacitance values. Thereafter, the ratio (%) of the number of defectives per the number evaluated (100) was calculated. The number of electronic components evaluated for each of samples 7 to 12 was 100. Each of samples 7 to 12 was arranged as with the electronic component shown in FIG. 11 in which the conductors were in a 4-axis arrangement.

TABLE 2

| | ARRANGEMENT | THROUGH HOLE DIAMETER RATIO $\alpha 2 = (D3/D4)$ | FRACTION DEFECTIVE (%) |
|---|---|---|---|
| SAMPLE 7 | 4-AXIS | 1.00 | 69 |
| SAMPLE 8 | 4-AXIS | 1.05 | 5 |
| SAMPLE 9 | 4-AXIS | 1.10 | 0 |
| SAMPLE 10 | 4-AXIS | 1.20 | 0 |
| SAMPLE 11 | 4-AXIS | 2.00 | 0 |
| SAMPLE 12 | 4-AXIS | 5.00 | 0 |

As shown in Table 2, the fraction defective reaches 69% in sample 7 in which $\alpha 2 = 1.00$. By contrast, samples 8 to 12 satisfying the relationship of $$1 < \alpha 2 \leq 5$$

exhibits the fraction defective of about several % at the maximum. Thus, this embodiment yields a remarkable effect of lowering the fraction defective, thereby verifying the effectiveness of this embodiment.

Figure 15:
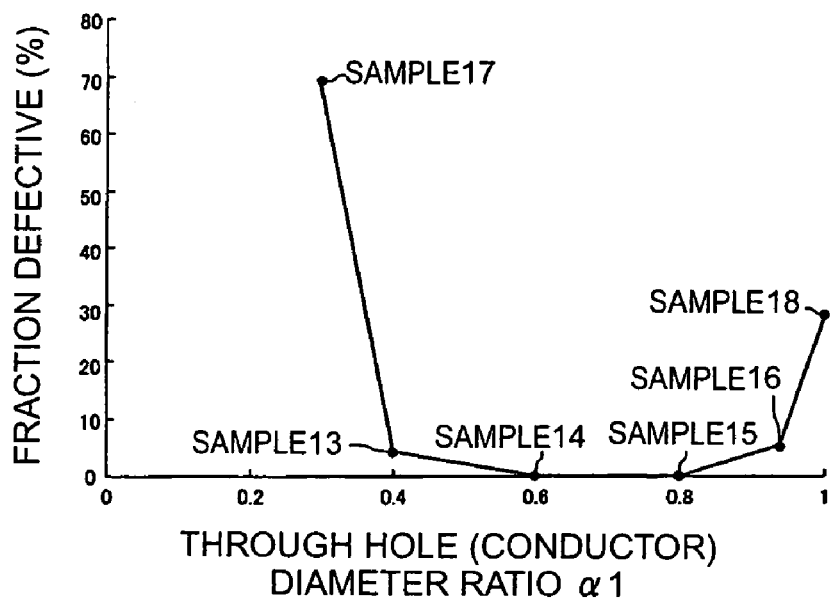

As with Table 1, Table 3 is a chart showing the relationship between the through hole (conductor) diameter ratio $\alpha 1 (=D5/D4)$ and the fraction defective. FIG. 15 is a graph showing the relationship between the through hole (conductor) diameter ratio $\alpha 1$ and the fraction defective.

Whether each electronic component was favorable or not was evaluated by determining whether or not capacity leak occurred therein due to through hole disconnection upon application of an electric field. First, after depolarization, the capacitance value was measured with an LCR meter. Subsequently, at room temperature (about 25° C.), the capacitance value obtained after an electric field of 1 kV per 1 mm of the functional layer thickness was continuously applied for 100 hr as a sine wave of 100 kHz thereto was measured with the LCR meter. Then, the respective capacitance values obtained before and after applying the electric field were compared with each other, and the measured objects were considered defective if a significant difference was seen between these capacitance values. Thereafter, the ratio (%) of the number of defectives per the number evaluated (100) was calculated. The number of electronic components evaluated for each of samples 13 to 18 was 100.

Each of samples 13 to 18 was arranged as with the electronic component shown in FIG. 11 in which the conductors were in a 4-axis arrangement. The number of samples evaluated was 100 for each condition. Samples 13 to 16 were those in which the through hole (conductor) diameter ratio $\alpha 1$ was set such that $$0.4 \leq \alpha 1 \leq 0.94$$

as shown in Table 3 and FIG. 15. Sample 17 was set such that $$\alpha 1 < 0.4.$$

Sample 18 was set such that $$\alpha 1 > 0.94.$$

TABLE 3

| | ARRANGEMENT | THROUGH HOLE DIAMETER RATIO $\alpha 1 = (D5/D4)$ | FRACTION DEFECTIVE (%) |
|---|---|---|---|
| SAMPLE 13 | 4-AXIS | 20/50 = 0.4 | 4 |
| SAMPLE 14 | 4-AXIS | 30/50 = 0.6 | 0 |
| SAMPLE 15 | 4-AXIS | 40/50 = 0.8 | 0 |
| SAMPLE 16 | 4-AXIS | 47/50 = 0.94 | 5 |
| SAMPLE 17 | 4-AXIS | 15/50 = 0.3 | 69 |
| SAMPLE 18 | 4-AXIS | 50/50 = 1 | 28 |

As can be seen from Table 3 and FIG. 15, the fraction defective of sample 11 in which the through hole (conductor) diameter ratio $\alpha 1$ is 0.3 reaches 69%. The fraction defective of sample 12 in which the through hole (conductor) diameter ratio $\alpha 1$ is 1 reaches 28%.

By contrast, samples 13 to 16 having respective through hole (conductor) diameter ratios $\alpha 1$ of 0.4, 0.6, 0.8, and 0.94 exhibit a fraction defective of only about several %.

Namely, it can be seen that the yield can remarkably be improved when the through hole (conductor) diameter ratio $\alpha 1$ is set such that $$0.4 \leq \alpha 1 \leq 0.94.$$

The foregoing has verified the effectiveness of this embodiment.

The present invention is not limited to the above-mentioned embodiments. For example, though the conductors 301 to 304, 311 to 313 (through holes 141 to 143, 151 to 156) are disposed on three or four axes such that their center axes deviate from each other in the second and third embodiments, they may be disposed on five or more axes.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An electronic component comprising:
   a substrate having multiple layers,
   each layer having one or more through-holes,
   each through-hole having a conductor disposed therein for electrically connecting one surface of the layer to the other surface of the layer,
   and each through-hole having a major axis diameter and a minor axis diameter on at least one surface of the layer,
   wherein the through-holes in a layer are shifted in location so as to not overlap the through-holes in each adjacent layer,
   and wherein the directional orientation of the major and minor axes of the through-holes in each layer are the same as the directional orientation of the major and minor axes of the through-holes in adjacent layers.

2. The electronic component according to claim 1, wherein the through hole has a form satisfying $1 < (D3/D4) \leq 5$ where D3 is the major axis diameter on the one side, and D4 is the minor axis diameter on the one side.

3. The electronic component according to claim 1, wherein the through hole has a form satisfying $0.4 < (D5/D4) \leq 0.94$ where D4 is the minor axis diameter on the one side, and D5 is the minor axis diameter on the other side.

4. The electronic component according to claim 1, wherein the major axes of the through-holes in each layer are aligned with the major axes of the through-holes in adjacent layer.

5. The electronic component according to claim 1, wherein the substrate comprises a piezoelectric material and functions as an actuator.

6. The electronic component according to claim 5, wherein a region overlapping in the substrate with the first electrode film and the second electrode film functions as an active region of the actuator.

7. The electronic component according to claim 1, further comprising one or more conductive films arranged on one or more surfaces of the layers of the substrate, wherein the conductor electrically connects the conductive films to each other.

8. The electronic component according to claim 7, wherein the through hole has a length D0 of $D0 \leq 500$ μm in each conductive film as seen in a minor axis direction.

9. The electronic component according to claim 7, wherein the through hole is formed so as to have a major axis direction extending along a longitudinal direction of the conductive films.

10. The electronic component according to claim 7, wherein the conductive film comprises a first electrode film, a first terminal electrode film, a second electrode film, and a second terminal electrode film;

wherein the first electrode film and first terminal electrode film are disposed at the same position as seen in the thickness direction of the substrate with a first insulating gap therebetween;

wherein the second electrode film and second terminal electrode film are disposed at the same position as seen in the thickness direction of the substrate with a second insulating gap therebetween;

wherein the second electrode film opposes the first electrode film and first terminal electrode film by way of the substrate;

wherein the second terminal electrode film opposes the first electrode film by way of the substrate;

wherein the conductor includes a first conductor and a second conductor;

wherein the first conductor electrically connects the first electrode film and the second terminal electrode film to each other; and wherein the second conductor electrically connects the second electrode film and the first terminal electrode film to each other.

11. The electronic component according to claim 10, wherein a group of the first electrode film and first terminal electrode film and a group of the second electrode film and second terminal electrode film are alternately disposed within the substrate with a gap in the thickness direction of the substrate.

* * * * *